United States Patent
Chen et al.

(10) Patent No.: US 11,228,321 B2
(45) Date of Patent: Jan. 18, 2022

(54) SYSTEM AND METHOD FOR PROCESSING POLAR CODE

(71) Applicant: ZTE CORPORATION, Guangdong (CN)

(72) Inventors: Mengzhu Chen, Guangdong (CN); Hui Wang, Guangdong (CN); Jin Xu, Guangdong (CN); Jun Xu, Guangdong (CN)

(73) Assignee: ZTE CORPORATION, Guangdong (CN)

( * ) Notice: Subject to any disclaimer, the term of this patent is extended or adjusted under 35 U.S.C. 154(b) by 0 days.

(21) Appl. No.: 16/784,050

(22) Filed: Feb. 6, 2020

(65) Prior Publication Data
US 2020/0177201 A1 Jun. 4, 2020

Related U.S. Application Data

(63) Continuation of application No. PCT/CN2017/097085, filed on Aug. 11, 2017.

(51) Int. Cl.
| | |
|---|---|
| *H03M 13/13* | (2006.01) |
| *H03M 13/03* | (2006.01) |
| *H03M 13/27* | (2006.01) |
| *H03M 13/00* | (2006.01) |

(52) U.S. Cl.
CPC ......... *H03M 13/13* (2013.01); *H03M 13/036* (2013.01); *H03M 13/2707* (2013.01); *H03M 13/6356* (2013.01)

(58) Field of Classification Search
CPC .................................................. H03M 13/13
See application file for complete search history.

(56) References Cited

U.S. PATENT DOCUMENTS

| | | | |
|---|---|---|---|
| 2016/0079999 A1 | 3/2016 | Shen | |
| 2016/0352419 A1 | 12/2016 | Fonseka et al. | |
| 2017/0019214 A1* | 1/2017 | Shen | H04L 1/0067 |
| 2017/0331590 A1* | 11/2017 | Wu | H04L 1/1819 |
| 2017/0364399 A1* | 12/2017 | Shi | H03M 13/618 |
| 2017/0366205 A1* | 12/2017 | Zhang | H03M 13/635 |
| 2017/0366206 A1* | 12/2017 | Zhang | H04L 1/0069 |
| 2018/0048418 A1* | 2/2018 | Ge | H04W 72/0453 |

FOREIGN PATENT DOCUMENTS

| | | |
|---|---|---|
| CN | 103023618 A | 4/2013 |
| CN | 104219019 A | 12/2014 |
| CN | 107026709 A | 8/2017 |
| WO | 2009041783 A1 | 4/2009 |

* cited by examiner

*Primary Examiner* — Joseph D Torres
(74) *Attorney, Agent, or Firm* — Duane Morris LLP

(57) ABSTRACT

A system and method for allocating network resources are disclosed herein. In one embodiment, the system and method are configured to perform: receiving, by a Polar code encoder, a plurality of information bits; encoding, by the Polar code encoder, the plurality of information bits using a construction sequence to generate a plurality of encoded information bits, wherein the construction sequence comprising a plurality of construction sequence indexes, wherein the encoding comprises placing the plurality of information bits on respective indexes according to at least one of a plurality of subsets of the construction sequence indexes; and outputting the plurality of encoded information bits.

16 Claims, 4 Drawing Sheets

SYSTEM AND METHOD FOR PROCESSING POLAR CODE

TECHNICAL FIELD

The disclosure relates generally to wireless communications and, more particularly, to systems and methods for processing a Polar code.

BACKGROUND

In a communications system, channel encoding is generally performed to improve reliability of data transmission and ensure quality of communication. A Polar code is an encoding technique that can achieve a Shannon limit and has low coding-decoding complexity. The Polar code is a linear block code. A generator matrix of the polar code is $G_N$, and an encoding process of the polar code is $x^N = u^N G_N$, wherein $x^N$ ($x^N = \{x_1, x_2, \ldots, x_N\}$) is typically referred to as a Polar code output, $u^N$ ($u^N = \{u_1, u_2, \ldots, u_N\}$) is typically referred to as a Polar code input, and N represents a code length, which is required to be a power of 2 (i.e., $2^n$, wherein n is a positive integer).

In general, a construction sequence having a plurality of indexes are provided, and respective index locations of a plurality of information bits that are to be processed by the generator matrix $G_N$ are determined based on the indexes. For purposes of clarity of illustration, such an index of the construction sequence is herein referred to as a "construction sequence index." Also, as mentioned above, since the Polar code input and output are required to be an integer power of 2, respectively, when a bit length of a codeword to be transmitted is not the integer power of 2, a rate matching technique is typically performed to discard one or more encoded bits (e.g., one or more bits of the Polar code output).

However, due to various application demands in a new radio (NR) wireless communication system/network, existing construction sequences and rate matching techniques are not entirely satisfactory, respectively.

SUMMARY OF THE INVENTION

The exemplary embodiments disclosed herein are directed to solving the issues relating to one or more of the problems presented in the prior art, as well as providing additional features that will become readily apparent by reference to the following detailed description when taken in conjunction with the accompany drawings. In accordance with various embodiments, exemplary systems, methods, devices and computer program products are disclosed herein. It is understood, however, that these embodiments are presented by way of example and not limitation, and it will be apparent to those of ordinary skill in the art who read the present disclosure that various modifications to the disclosed embodiments can be made while remaining within the scope of the invention.

In one embodiment, a method for channel coding includes: receiving, by a Polar code encoder, a plurality of information bits; encoding, by the Polar code encoder, the plurality of information bits using a construction sequence to generate a plurality of encoded information bits, wherein the construction sequence comprising a plurality of construction sequence indexes, wherein the encoding comprises placing the plurality of information bits on respective indexes according to at least one of a plurality of subsets of the construction sequence indexes; and outputting the plurality of encoded information bits.

In a further embodiment, a method for channel coding includes: receiving, by a Polar code encoder, a plurality of information bits; encoding, by the Polar code encoder, the plurality of information bits using a construction sequence comprising a first plurality of construction sequence indexes and a sequence comprising a second plurality of sequence indexes to generate a plurality of encoded information bits, wherein the second plurality of sequence indexes correspond to a subset of a Polar code output not to be transmitted, and wherein the encoding comprises: generating a fully filled first dummy sequence by selecting a first subset of the second plurality of sequence indexes that are each within a first index range; generating a fully filled second dummy sequence by selecting a second subset of the second plurality of sequence indexes that are each within a second index range; and placing the plurality of information bits on respective indexes based on a difference between the construction sequence and a combination of the fully filled first and second dummy sequences; and outputting the plurality of encoded information bits.

In another embodiment, a method includes: grouping a plurality of Polar code output into a plurality of subsets of encoded bits; interleaving each of the plurality of subsets of encoded bits; and combining the plurality of subsets of encoded bits as an interleaved output to be transmitted.

BRIEF DESCRIPTION OF THE DRAWINGS

Various exemplary embodiments of the invention are described in detail below with reference to the following Figures. The drawings are provided for purposes of illustration only and merely depict exemplary embodiments of the invention to facilitate the reader's understanding of the invention. Therefore, the drawings should not be considered limiting of the breadth, scope, or applicability of the invention. It should be noted that for clarity and ease of illustration these drawings are not necessarily drawn to scale.

DETAILED DESCRIPTION OF EXEMPLARY EMBODIMENTS

Various exemplary embodiments of the invention are described below with reference to the accompanying figures to enable a person of ordinary skill in the art to make and use the invention. As would be apparent to those of ordinary skill in the art, after reading the present disclosure, various changes or modifications to the examples described herein can be made without departing from the scope of the invention. Thus, the present invention is not limited to the exemplary embodiments and applications described and illustrated herein. Additionally, the specific order or hierarchy of steps in the methods disclosed herein are merely exemplary approaches. Based upon design preferences, the specific order or hierarchy of steps of the disclosed methods or processes can be re-arranged while remaining within the scope of the present invention. Thus, those of ordinary skill in the art will understand that the methods and techniques disclosed herein present various steps or acts in a sample order, and the invention is not limited to the specific order or hierarchy presented unless expressly stated otherwise.

Figure 1:
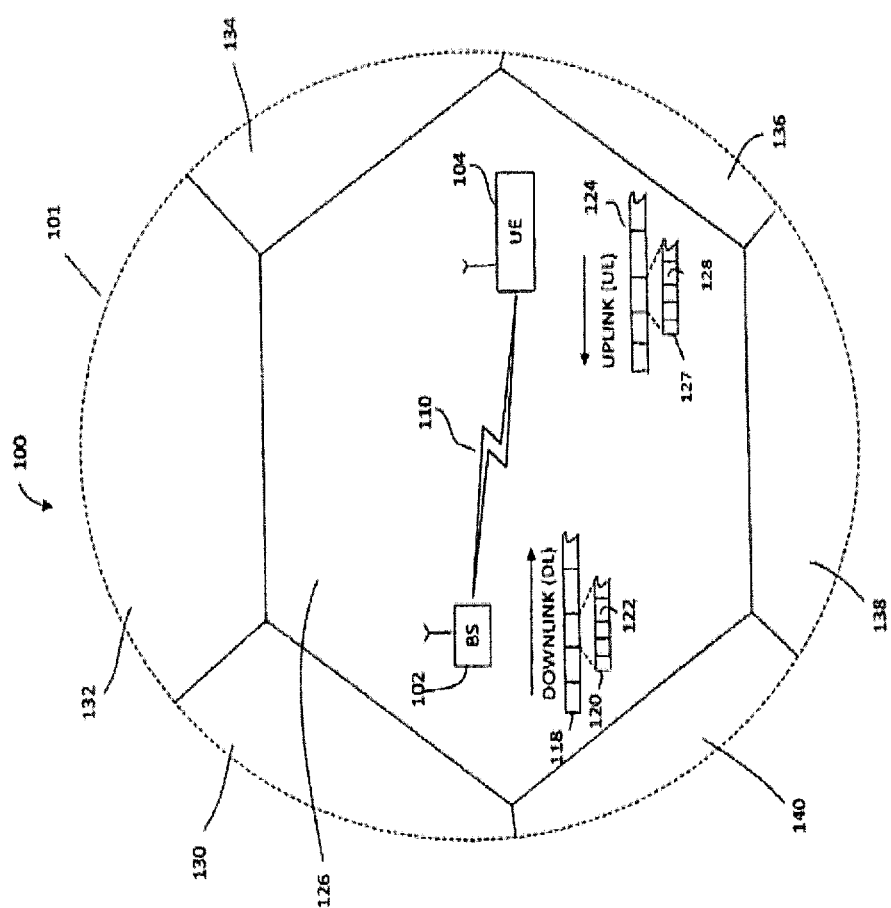
FIG. 1 illustrates an exemplary cellular communication network in which techniques disclosed herein may be implemented, in accordance with an embodiment of the present disclosure.

FIG. 1 illustrates an exemplary wireless communication network 100 in which techniques disclosed herein may be implemented, in accordance with an embodiment of the present disclosure. Such an exemplary network 100 includes a base station 102 (hereinafter "BS 102") and a user equipment device 104 (hereinafter "UE 104") that can communicate with each other via a communication link 110 (e.g., a wireless communication channel), and a cluster of notional cells 126, 130, 132, 134, 136, 138 and 140 overlaying a geographical area 101. In FIG. 1, the BS 102 and UE 104 are contained within a respective geographic boundary of cell 126. Each of the other cells 130, 132, 134, 136, 138 and 140 may include at least one base station operating at its allocated bandwidth to provide adequate radio coverage to its intended users.

For example, the BS 102 may operate at an allocated channel transmission bandwidth to provide adequate coverage to the UE 104. The BS 102 and the UE 104 may communicate via a downlink radio frame 118, and an uplink radio frame 124 respectively. Each radio frame 118/124 may be further divided into sub-frames 120/127 which may include data symbols 122/128. In the present disclosure, the BS 102 and UE 104 are described herein as non-limiting examples of "communication nodes," generally, which can practice the methods disclosed herein. Such communication nodes may be capable of wireless and/or wired communications, in accordance with various embodiments of the invention.

Figure 2:
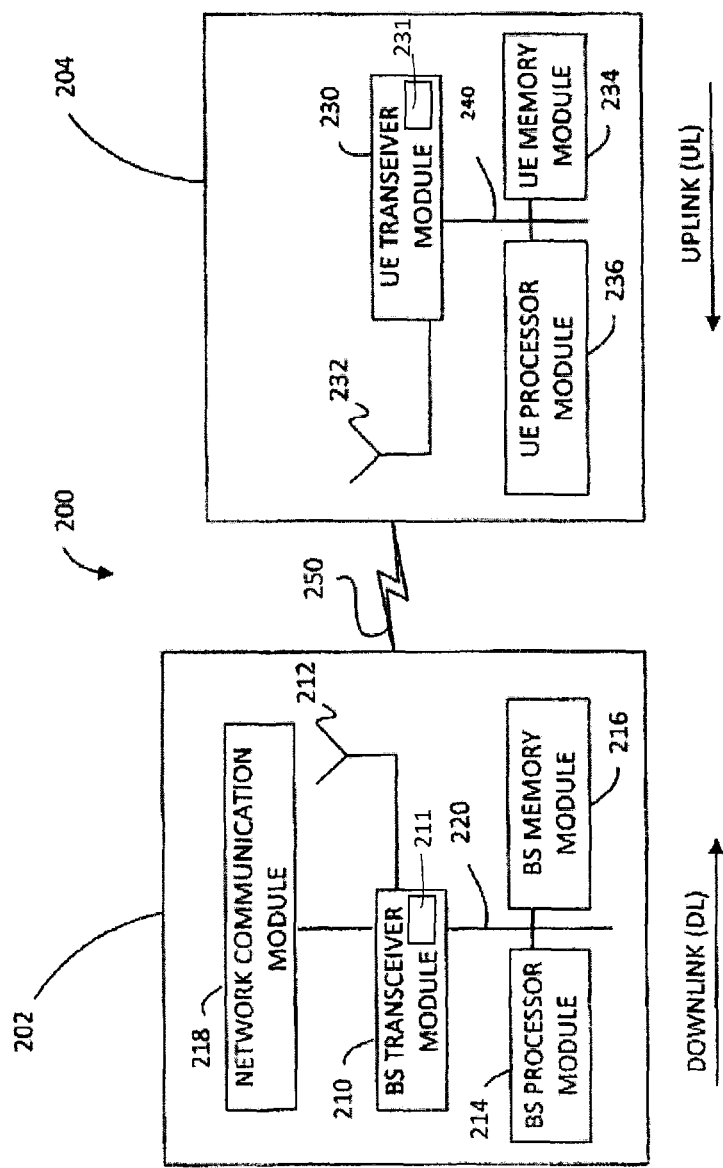
FIG. 2 illustrates block diagrams of an exemplary base station and a user equipment device, in accordance with some embodiments of the present disclosure.

FIG. 2 illustrates a block diagram of an exemplary wireless communication system 200 for transmitting and receiving wireless communication signals, e.g., OFDM/OFDMA signals, in accordance with some embodiments of the invention. The system 200 may include components and elements configured to support known or conventional operating features that need not be described in detail herein. In one exemplary embodiment, system 200 can be used to transmit and receive data symbols in a wireless communication environment such as the wireless communication environment 100 of FIG. 1, as described above.

System 200 generally includes a base station 202 (hereinafter "BS 202") and a user equipment device 204 (hereinafter "UE 204"). The BS 202 includes a BS (base station) transceiver module 210, a BS antenna 212, a BS processor module 214, a BS memory module 216, and a network communication module 218, each module being coupled and interconnected with one another as necessary via a date communication bus 220. The UE 204 includes a UE (user equipment) transceiver module 230, a UE antenna 232, a UE memory module 234, and a UE processor module 236, each module being coupled and interconnected with one another as necessary via a data communication bus 240. The BS 202 communicates with the UE 204 via a communication channel 250, which can be any wireless channel or other medium known in the art suitable for transmission of data as described herein.

As would be understood by persons of ordinary skill in the art, system 200 may further include any number of modules other than the modules shown in FIG. 2. Those skilled in the art will understand that the various illustrative blocks, modules, circuits, and processing logic described in connection with the embodiments disclosed herein may be implemented in hardware, computer-readable software, firmware, or any practical combination thereof. To clearly illustrate this interchangeability and compatibility of hardware, firmware, and software, various illustrative components, blocks, modules, circuits, and steps are described generally in terms of their functionality. Whether such functionality is implemented as hardware, firmware, or software depends upon the particular application and design constraints imposed on the overall system. Those familiar with the concepts described herein may implement such functionality in a suitable manner for each particular application, but such implementation decisions should not be interpreted as limiting the scope of the present invention.

In accordance with some embodiments, the UE transceiver module 230 may be referred to herein as an "uplink" transceiver module 230 that includes a RF transmitter and receiver circuitry that are each coupled to the antenna 232. A duplex switch (not shown) may alternatively couple the uplink transmitter or receiver to the uplink antenna in time duplex fashion. Similarly, in accordance with some embodiments, the BS transceiver module 210 may be referred to herein as a "downlink" transceiver module 210 that includes RF transmitter and receiver circuitry that are each coupled to the antenna 212. A downlink duplex switch may alternatively couple the downlink transmitter or receiver to the downlink antenna 212 in time duplex fashion. The operations of the two transceiver modules 210 and 230 are coordinated in time such that the uplink receiver is coupled to the uplink antenna 232 for reception of transmissions over the wireless transmission link 250 at the same time that the downlink transmitter is coupled to the downlink antenna 212. Preferably there is close time synchronization with only a minimal guard time between changes in duplex direction.

The UE transceiver module 230 and the BS transceiver module 210 are configured to communicate via the wireless data communication link 250, and cooperate with a suitably configured RF antenna arrangement 212/232 that can support a particular wireless communication protocol and modulation scheme. In some exemplary embodiments, the UE transceiver module 210 and the BS transceiver module 210 are configured to support industry standards such as the Long Term Evolution (LTE) and emerging 5G standards, and the like. It is understood, however, that the invention is not necessarily limited in application to a particular standard and associated protocols. Rather, the UE transceiver module 230 and the BS transceiver module 210 may be configured to support alternate, or additional, wireless data communication protocols, including future standards or variations thereof.

In accordance with various embodiments, each of the BS transceiver module 210 and the UE transceiver module 230 includes a Polar encoder module, 211 and 231. In some embodiments, the Polar encoder module is configured to perform a Polar coding by applying the aforementioned $G_N$ matrix on a Polar code input to generate a Polar code output. As will be discussed below, such Polar code input and output may be processed by at least one of various disclosed techniques so as to satisfy respective application demands.

In accordance with various embodiments, the BS 202 may be an evolved node B (eNB), a serving eNB, a target eNB, a femto station, or a pico station, for example. In some embodiments, the UE 204 may be embodied in various types of user devices such as a mobile phone, a smart phone, a personal digital assistant (PDA), tablet, laptop computer, wearable computing device, etc. The processor modules 214 and 236 may be implemented, or realized, with a general purpose processor, a content addressable memory, a digital signal processor, an application specific integrated circuit, a field programmable gate array, any suitable programmable logic device, discrete gate or transistor logic, discrete hardware components, or any combination thereof, designed to perform the functions described herein. In this manner, a processor may be realized as a microprocessor, a controller, a microcontroller, a state machine, or the like. A processor may also be implemented as a combination of computing devices, e.g., a combination of a digital signal processor and a microprocessor, a plurality of microprocessors, one or more microprocessors in conjunction with a digital signal processor core, or any other such configuration.

Furthermore, the steps of a method or algorithm described in connection with the embodiments disclosed herein may be embodied directly in hardware, in firmware, in a software module executed by processor modules 214 and 236, respectively, or in any practical combination thereof. The memory modules 216 and 234 may be realized as RAM memory, flash memory, ROM memory, EPROM memory, EEPROM memory, registers, a hard disk, a removable disk, a CD-ROM, or any other form of storage medium known in the art. In this regard, memory modules 216 and 234 may be coupled to the transceiver modules 210 and 230, respectively, such that the transceiver modules 210 and 230 can read information from, and write information to, memory modules 216 and 234, respectively. The memory modules 216 and 234 may also be integrated into their respective transceiver modules 210 and 230. In some embodiments, the memory modules 216 and 234 may each include a cache memory for storing temporary variables or other intermediate information during execution of instructions to be executed by transceiver modules 210 and 230, respectively. Memory modules 216 and 234 may also each include non-volatile memory for storing instructions to be executed by the transceiver modules 210 and 230, respectively.

The network communication module 218 generally represents the hardware, software, firmware, processing logic, and/or other components of the base station 202 that enable bi-directional communication between the BS transceiver module 210 and other network components and communication nodes configured to communication with the base station 202. For example, network communication module 218 may be configured to support internet or WiMAX traffic. In a typical deployment, without limitation, network communication module 218 provides an 802.3 Ethernet interface such that the BS transceiver module 210 can communicate with a conventional Ethernet based computer network. In this manner, the network communication module 218 may include a physical interface for connection to the computer network (e.g., Mobile Switching Center (MSC)). The terms "configured for," "configured to" and conjugations thereof, as used herein with respect to a specified operation or function, refer to a device, component, circuit, structure, machine, signal, etc., that is physically constructed, programmed, formatted and/or arranged to perform the specified operation or function.

The present disclosure provides various embodiments of systems and methods to process a Polar code input and/or a Polar code output. In a first embodiment, a construction sequence having a plurality of construction sequence indexes that is used to place a plurality of information bits into respective indexes prior to being Polar encoded (i.e., processing the Polar code input) is disclosed. In particular, plural subsets of the plurality of construction sequence indexes may meet respective criteria. In a second embodiment, a method to determine respective indexes to place information bits based on a transmission requirement is disclosed. In a third embodiment, a novel interleaving technique to process the Polar code output is disclosed.

Embodiment 1

As mentioned above, a disclosed construction sequence, used to place a plurality of information bits into respective indexes prior to being Polar encoded, has a plurality of construction sequence indexes. In other words, respective index locations of the plurality information bits can be determined based on the disclosed construction sequence. And the plurality of construction sequence indexes of the disclosed construction sequence include at least one of a first subset, a second subset, a third subset, a fourth subset, a fifth subset, and a sixth subset that may each meet a respective criterion, which are respectively discussed below.

In some embodiments, the first subset of the construction sequence indexes is generated by ranking a first plurality of construction sequence indexes based on respective associated reliability values. In some embodiments, the respective reliability values may be generated by a monotonic function. In an example where the construction sequence indexes of the first subset of the consequence sequence indexes include 0 to 15, a monotonic function is used to generate 16 respective reliability values $\{0, 1, 1.18, 2.18, 1.41, 2.41, 2.60, 3.60, 1.68, 2.68, 2.87, 3.87, 3.09, 4.09, 4.28, 5.28\}$ for the construction sequence indexes of first subset $\{0, 1, 2, 3, 4, 5, 6, 7, 8, 9, 10, 11, 12, 13, 14, 15\}$, respectively. Based on the reliability values, the construction sequence indexes are ranked from the smallest to the largest as $\{0, 1, 2, 4, 8, 3, 5, 6, 9, 10, 12, 7, 11, 13, 14, 15\}$. In some embodiments, the lager the reliability value is, the more reliable the corresponding construction sequence index is, which may be prioritized to place information bits. In the current example where the information bits have 8 bits, the first 8 construction sequence indexes (i.e., $\{9, 10, 12, 7, 11, 13, 14, 15\}$) with the 8 largest reliability values are used to place the 8 information bits, according to some embodiments.

In some embodiments, the second subset of the construction sequence indexes includes at least a first construction sequence index, "i," and a second construction sequence index, "j," that meet a respective criterion: an equivalent binary number of the first construction sequence index comprises a first bit and an equivalent binary number of the second construction sequence indexes comprises a second bit, wherein the first and second bits are logically inverted to each other, and remaining bits of the equivalent binary number of the first construction sequence index are each identical to a corresponding one of remaining bits of the equivalent binary number of the second construction sequence index. As such, the first construction index i and second construction index j are formed as a pair, and the first construction index i is arranged either before or after the second construction index j. Further, in some embodiments, all the remaining construction sequence indexes in the second subset may meet such a criterion. In other words, all the remaining construction sequence indexes in the second subset are formed as one or more pairs that each follows the same order of the first and second construction indexes.

For example, when the equivalent binary number of the first construction sequence index i is expressed as: (a, b, c, 0) and the equivalent binary number of the second construction sequence index j is expressed as: (a, b, c, 1), the last bit of the equivalent binary numbers of the first and second construction sequence indexes are logically inverted to each other and other (i.e., remaining) bits (e.g., bits "a," "b," and "c") are the same. It is noted that a number of the same bits is not limited to 3 as provided in the current example. Thus, the number of the same bits respectively contained in the equivalent binary numbers of the first and second construction sequence indexes can be any number while remaining within the scope of the present disclosure.

In some embodiments, the third subset of the construction sequence indexes includes at least a first construction sequence index, "i," and a second construction sequence index, "j," that meet a respective criterion: an equivalent binary number of the first construction sequence index comprises respective first and second bits and an equivalent binary number of the second construction sequence indexes comprises respective first and second bits, wherein the first bit of the equivalent binary number of the first construction sequence index and the first bit of the equivalent binary number of the second construction sequence index are logically inverted to each other, and the second bit of the equivalent binary number of the first construction sequence index and the second bit of the equivalent binary number of the second construction sequence index are logically inverted to each other, and remaining bits of the equivalent binary number of the first construction sequence index are each identical to a corresponding one of remaining bits of the equivalent binary number of the second construction sequence index. As such, the first construction index i and second construction index j are formed as a pair, and the first construction index i is arranged either before or after the second construction index j. Further, in some embodiments, all the remaining construction sequence indexes in the third subset may meet such a criterion. In other words, all the remaining construction sequence indexes in the third subset are formed as one or more pairs that each follows the same order of the first and second construction indexes.

For example, when the equivalent binary number of the first construction sequence index i is expressed as: (a, 1, 0, b, c) and the equivalent binary number of the second construction sequence index j is expressed as: (a, 0, 1, b, c), the second and third bits of the equivalent binary numbers of the first and second construction sequence indexes are logically inverted to each other, respectively, and other bits (e.g., bits "a," "b," and "c") are the same. It is noted that a number of the same bits is not limited to 3 as provided in the current example. Thus, the number of the same bits respectively contained in the equivalent binary numbers of the first and second construction sequence indexes can be any number while remaining within the scope of the present disclosure.

In some embodiments, the fourth subset of the construction sequence indexes includes at least a first group of construction sequence indexes and a second group of construction sequence indexes that meet a third criterion: the first group is offset from the second group by a constant value. For example, the first group of construction sequence indexes are {1, 3, 2, 4}, and the second group of construction sequence indexes are {5, 7, 6, 8}. As such, each construction sequence index of the first group is offset from the corresponding construction sequence index of the second group by a constant value: 4.

In some embodiments, the fifth subset of the construction sequence indexes is generated based on a plurality of sub-sequences, and wherein each construction sequence index of the fifth subset are each selected from a sub-construction sequence index of one of the plurality of sub-sequences. Detailed steps to generate the fifth subset of the construction sequence indexes are described in the below example.

For example, when two sub-sequences S1, {3, 2, 1, 0}, and S2, {3, 1, 2, 0}, are provided to generate the fifth subset of the construction sequence indexes, a first step is to select first construction sequence indexes from the sub-sequences S1 and S2, respectively, to form a first construction sequence index of the fifth subset of the construction sequence indexes, which is 3 in the current example.

A second step is to delete the selected construction sequence index, 3, from the sub-sequences S1 and S2, respectively, to generate two updated sub-sequences: S1' and S2'. S1'={2, 1, 0} and S2'={1, 2, 0}. Next, a third step is to select first construction sequence indexes from the updated sub-sequences S1' and S2', respectively, to form a second construction sequence index of the fifth subset of the construction sequence indexes. In the current example, the first construction sequence indexes of the updated sub-sequences S1' is 2, and the first construction sequence indexes of the updated sub-sequences S2' is 1. In such a scenario, a trial process may be performed to test (e.g., simulate) whether using 2 or 1 may yield better performance (e.g., a lower block error ratio (BLER), etc.), according to some embodiments. The construction sequence index that yields better performance is then selected as the second construction sequence index of the fifth subset. Following the steps discussed above until the fifth subset has a number of construction sequence indexes that is equal to the length of the sub-sequences (i.e., the number of the construction sequence indexes in the sub-sequences), the fifth subset may be generated.

In some embodiments, the sixth subset of the construction sequence indexes is generated based on a plurality of pre-defined sequences: S1, S2, S3, S4, and S5, which will be provided below. In particular, the $n_1^{th}$ to the $n_2^{th}$ construction sequence indexes of the disclosed construction sequence indexes are identical to the $n_1^{th}$ to the $n_2^{th}$ sequence indexes of any one of the five pre-defined sequences S1 to S5.

In some embodiments, the sixth subset of the construction sequence indexes is generated based on one common pre-defined sequence selected from the plurality of pre-defined sequences: S1, S2, S3, S4, and S5. In particular, the $n_1^{th}$ to the $n_2^{th}$ construction sequence indexes of the disclosed construction sequence indexes are each identical to the $n_1^{th}$ to the $n_2^{th}$ sequence indexes of the common pre-defined sequence, and the $(n_1+n)^{th}$ to the $(n_2+n)^{th}$ construction sequence indexes of the disclosed construction sequence indexes are also each identical to the $n_1^{th}$ to the $n_2^{th}$ sequence indexes of the common pre-defined sequence.

In some embodiments, the sixth subset of the construction sequence indexes is generated based on one common pre-defined sequence selected from the plurality of pre-defined sequences: S1, S2, S3, S4, and S5, and all the other construction sequence indexes (excluding the sixth subset) in the disclosed construction sequence indexes are generated based on another different pre-defined sequence selected from S1 to S5. In particular, the $n_1^{th}$ to the $n_2^{th}$ construction sequence indexes of the disclosed construction sequence indexes are each identical to the $n_1^{th}$ to the $n_2^{th}$ sequence indexes of the common pre-defined sequence, the $(n_1+n)^{th}$ to the $(n_2+n)^{th}$ construction sequence indexes of the disclosed construction sequence indexes are also each identical to the $n_1^{th}$ to the $n_2^{th}$ sequence indexes of the common pre-defined sequence, and all the remaining construction sequence indexes of the disclosed construction sequence indexes are each identical to another pre-defined sequence different from the common pre-defined sequence.

In some embodiments, the pre-defined sequence S1 includes: [0,1,2,4,8,16,32,3,5,64,9,6,17,10,18,128,12,33,65, 20,256,34,24,36,7,129,66,512,11,40,68,130,19,13,48,14,72, 257,21,132,35,258,26,513,80,37,25,22,136,260,264,38,514, 96,67,41,144,28,69,42,5 16,49,74,272,160,520,288,528, 192,544,70,44,131,81,50,73,15,320,133,52,23,134,384,76, 137,82, 56,27,97,39,259,84,138,145,261,29,43,98,515,88, 140,30,146,71,262,265,161,576,45,100,640,51, 148,46,75, 266,273,517,104,162,53,193,152,77,164,768,268,274,518, 54,83,57,521,112,135,78,28 9,194,85,276,522,58,168,139, 99,86,60,280,89,290,529,524,196,141,101,147,176,142, 530,321,31,200,90,545,292,322,532,263,149,102,105,304, 296,163,92,47,267,385,546,324,208,386,150,153, 165,106, 55,328,536,577,548,113,154,79,269,108,578,224,166,519, 552,195,270,641,523,275,580,291,59,169,560,114,277,156, 87,197,116,170,61,531,525,642,281,278,526,177,293,388, 91,584,7 69,198,172,120,201,336,62,282,143,103,178,294, 93,644,202,592,323,392,297,770,107,180,151, 209,284, 648,94,204,298,400,608,352,325,533,155,210,305,547,300, 109,184,534,537,115,167,22 5,326,306,772,157,656,329, 110,117,212,171,776,330,226,549,538,387,308,216,416, 271,279,158,337,550,672,118,332,579,540,389,173,121, 553,199,784,179,228,338,312,704,390,174,554,581, 393, 283,122,448,353,561,203,63,340,394,527,582,556,181,295, 285,232,124,205,182,643,562,28 6,585,299,354,211,401, 185,396,344,586,645,593,535,240,206,95,327,564,800,402, 356,307,301, 417,213,568,832,588,186,646,404,227,896, 594,418,302,649,771,360,539,111,331,214,309,188,4 49,217,408,609,596,551,650,229,159,420,310,541,773,610, 657,333,119,600,339,218,368,652,23 0,391,313,450,542, 334,233,555,774,175,123,658,612,341,777,220,314,424, 395,673,583,355,287,183,234,125,557,660,616,342,316, 241,778,563,345,452,397,403,207,674,558,785,432,357, 187, 236,664,624,587,780,705,126,242,565,398,346,456, 358,405,303,569,244,595,189,566,676,361,7 06,589,215, 786,647,348,419,406,464,680,801,362,590,409,570,788, 597,572,219,311,708,598,60 1,651,421,792,802,611,602, 410,231,688,653,248,369,190,364,654,659,335,480,315, 221,370,613,422,425,451,614,543,235,412,343,372,775, 317,222,426,453,237,559,833,804,712,834,661,808, 779, 617,604,433,720,816,836,347,897,243,662,454,318,675, 618,898,781,376,428,665,736,567,8 40,625,238,359,457, 399,787,591,678,434,677,349,245,458,666,620,363,127, 191,782,407,436,62 6,571,465,681,246,707,350,599,668, 790,460,249,682,573,411,803,789,709,365,440,628,689, 374,423,466,793,250,371,481,574,413,603,366,468,655, 900,805,615,684,710,429,794,252,373,605, 848,690,713, 632,482,806,427,904,414,223,663,692,835,619,472,455, 796,809,714,721,837,716,8 64,810,606,912,722,696,377, 435,817,319,621,812,484,430,838,667,488,239,378,459, 622,627,43 7,380,818,461,496,669,679,724,841,629,351, 467,438,737,251,462,442,441,469,247,683,842,738,899, 670,783,849,820,728,928,791,367,901,630,685,844,633, 711,253,691,824,902,686,740,850, 375,444,470,483,415, 485,905,795,473,634,744,852,960,865,693,797,906,715, 807,474,636,694,2 54,717,575,913,798,811,379,697,431, 607,489,866,723,486,908,718,813,476,856,839,725,698,91 4,752,868,819,814,439,929,490,623,671,739,916,463,843, 381,497,930,821,726,961,872,492,631,729,700,443,741, 845,920,382,822,851,730,498,880,742,445,471,635,932, 687,903,825,500,846, 745,826,732,446,962,936,475,853, 867,637,907,487,695,746,828,753,854,857,504,799,255, 964,9 09,719,477,915,638,748,944,869,491,699,754,858, 478,968,383,910,815,976,870,917,727,493,87 3,701,931, 756,860,499,731,823,922,874,918,502,933,743,760,881, 494,702,921,501,876,847,992,447,733,827,934,882,937, 963,747,505,855,924,734,829,965,938,884,506,749,945, 966,755,859, 940,830,911,871,639,885,479,946,750,969, 508,861,757,970,919,875,862,758,948,977,923,972,7 61,877,952,495,703,935,978,883,762,503,925,878,735,993, 885,939,994,980,926,764,941,967,88 6,831,947,507,889, 984,751,942,996,971,890,509,949,973,1000,892,950,863, 759,1008,510,979,9 53,763,974,954,879,981,982,927,995, 765,956,887,985,997,986,943,891,998,766,511,988,1001,9 51,1002,893,975,894,1009,955,1004,1010,957,983,958, 987,1012,999,1016,767,989,1003,990,10 05,959,1011, 1013,895,1006,1014,1017,1018,991,1020,1007,1015,1019, 1021,1022,1023].

In some embodiments, the pre-defined sequence S2 includes: [0,1,2,4,8,16,32,3,64,5,6,9,128,256,10,17,12,512, 18,33,20,34,65,24,36,66,7,11,129,40,68,257,13,19,48,130, 72,14,258,21,80,260,35,132,22,25,264,513,37,136,96,272, 38,26,67,514,41,144,28,28 8,69,516,42,49,160,70,73,131, 44,50,320,520,74,81,15,52,384,133,192,528,134,23,76,56, 82,137, 27,259,544,97,261,39,84,138,145,29,98,262,265, 43,88,576,140,146,30,161,45,71,515,100,266,2 73,51,640, 148,268,75,104,162,46, 517,274,53,193,152,289,768,276, 77,54,83,518,57,521,164,112,135,78,194,290,280,522,58, 321,85,168,292,139,322,99,529,60,86,524,196,296,141,89, 263,385, 530,324,147,176,101,31,142,304,90,545,532,328, 105,386,200,149,102,47,208,546,92,267,150,5 36,163,388, 106,153,336,55,548,269,577,165,113,154,79,519,224,275, 392,270,352,166,578,400, 552,108,59,169,114,195,156, 116,277,278,641,523,580,87,560,197,170,291,416,281,293, 91,177, 120,198,584,642,61,282,525,201,448,294,103,172, 531,62,526,769,644,592,178,143,284,323,93, 202,297,209, 151,298,107,533,180,770,648,608,94,325,210,305,547,534, 300,326,155,109,204,53 7,772,184,387,306,271,329,656, 167,115,225,330,549,157,110,538,212,308,389,337,672, 776,332,550,312,171,117,579,226,540,279,118,553,158, 216,390,338,393,173,121,353,784,704,581,554, 340,199, 394,283,179,228,122,174,527,561,582,63, 556,181,232, 295,203,205,285,124,643,182,80 0,585,562,354,211,401, 299,185,240,206,586,95,564,535,344,645,356,402,286,832, 417,327,593, 588,301,396,307,568,646,213,186,418,360, 594,227,309,539,331,188,771,896,649,111,449,302,2 17,214,159,404,551,609,596,333,408,650,541,310,368,229, 773,119,339,218,313,230,420,657,61 0,542,652,600,175, 334,391,450,341,555,233,123,774,658,220,612,183,314, 777,395,424,355,234,125,583,241,557,345,342,452,673, 660,616,563,778,397,287,207,558,432,316,357,674,403, 236, 187,664,785,587,624,346,780,398,565,361,126,242, 456,405,676,705,215,786,189,244,566,358,5 89,647,303, 362,464,569,419,706,680,595,406,348,590,801,788,248, 219,409,570,311,421,543,70 8,369,802,651,688,597,190, 792,231,480,572,335,410,425,370,315,611,598,804,833, 712,221,422,653,364,601,235,317,775,451,343,659,412, 222,433,453,613,559,654,834,808,602,720,372,237, 426, 614,243,454,604,897,661,836,816,347,779,617,376,428, 457,736,318,359,245,675,567,662,1 27,238,840,465,618, 898,434,399,665,781,458,591,625,363,620,349,677,407, 436,787,666,246,78 2,571,900,848,350,249,626,460,411, 678,365,707,668,789,440,681,573,371,628,599,481,250, 904,864,423,803,574,466,790,413,366,468,191,709,682, 482,632,427,793,655,912,603,689,373,710, 684,252,414, 374,805,472,794,377,615,713,690,455,605,429,223,928, 806,484,714,835,796,435,6 63,606,430,692,809,619,319, 721,378,459,716,239,437,696,960,837,810,488,722,667, 461,380,62 1,247,783,467,817,838,627,812,679,622,737, 724,899,438,669,441,841,818,462,351,469,575,367,738, 629,670,442,728,842,683,791,820,251,901,630,470,740, 849,415,496,844,633,483,711,824, 902,685,444,473,850, 375,795,744,634,253,691,905,686,607,254,807,865,852, 636,715,485,906,431,797,752,693,474,379,913,866,798, 486,694,908,856,717,489,811,476,381,697,623,723,914,86 8,718,439,490,698,839,463,813,671,929,916,382,725,872, 819,497,700,814,443,631,492,739,930,726,920,843,498, 880,821,729,961,741,471,822,730,845,825,851,846,745, 445,742,932,635,255, 962,826,903,687,500,732,853,637, 446,746,867,907,695,475,719,753,936,854,487,909,944, 748,828,504,869,799,699,477,857,910,915,964,873,491, 638,754,968,727,478,917,858,701,756,383,921,870,815, 874,976,493,931,918,702,860,731,499,823,881,933,743, 494,847,501,922,827,760,447,733,876,934,963,882,937, 924,992,855,747,502,829,734,965,938,505,884,639,911, 830,749,506, 859,479,945,755,966,871,940,750,969,888, 508,861,946,919,757,703,970,875,495,862,948,758,9 77,923,761,972,877,935,978,883,503,952,762,925,735,878, 993,980,939,885,926,831,764,507,994,967,886,941,751, 984,889,509,947,996,942,971,890,510,863,949,759,1000, 973,892,950,979,953,763,974,879,1008,981,954,927,765, 995,982,887,956,766,985,997,943,986,891,511,998,1001,9 88,893,951,1002,975,894,1009,955,1004,1010,983,957, 767,1012,958,987,999,1016,989,1003,990,895,1005,1011, 1006,1013,959,1014,1017,1018,991,1020,1007,1015,1019, 1021,1022,1023].

In some embodiments, the pre-defined sequence S3 includes: [0,1,2,4,8,16,3,128,256,512,32,5,64,6,9,10,17,12, 18,33,129,20,34,24,65,257,7,36,66,11,40,130,513,68,13, 19,48,72,14,258,132,21,35,80,22,25,136,37,26,514,260,96, 67,144,38,41,28,69,131,264, 42,49,70,516,73,160,15,272, 44,50,133,74,81,23,259,520,192,52,76,134,82,27,384,56, 137,97,528,39,288,138,84,29,145,98,261,515,43,140,88,30, 320,146,100,71,640,161,262,45,51,148,104,265, 768,75, 162,46,266,152,53,77,544,193,273,112,135,83,268,517,54, 164,57,274,194,78,576,139,289,85,58,168,385,518,99,196, 276,86,141,521,89,290,147,31,280,176,522,60,101,321, 200,90,529, 263,142,102,292,524,149,105,163,322,47,530, 92,267,106,208,545,296,113,150,386,641,55,153, 324,165, 108,532,269,154,79,546,275,224,114,304,536,195,59,328, 166,577,270,116,169,388,769,87,156,277,519,197,291,61, 170,548,336,120,177,578,278,91,281,198,523,201,392,62, 552,293,143,282,642,103,172,352,580,178,323,93,525, 202,400,107,531,294,209,297,560,151,94,284,584, 180, 325,204,526,387,109,770,298,210,155,644,305,115,326, 533,184,329,547,225,416,110,592,271,167,534,300,212, 306,537,117,157,648,389,226,330,549,118,337,538,171, 279,772,216,448,608,121,308,158,579,332,228,656,390, 199,550,63,173,553,338,179,540,283,232,581,312,122,393, 643,203,353,776,174,295,554,124,394,561,340,582,181, 285,585,205,401,672,240,354,527,211,299,784,95,396, 556,182,344,562,185,286,645,206,586,402,356,593,111, 327,535,213,771,417,186,704,301,227,564,307,588,404, 214,646,360,119,594,331,539,217,418,896,302,159,568, 408,649, 188,309,609,333,551,229,449,800,123,650,368, 218,596,391,541,339,657,230,310,610,420,773,233,313, 555,175,652,450,334,600,220,542,395,832,125,341,658, 314,612,234,583,424,673,355,241,774,452,557,342,563, 183,397,660,236,616,345,777,403,587,207,287,674,432, 558,242,778,316,664,357,565,126,589,456,346,705,187, 785,398,624,358,647,244,595,405,780,361,566,215,676, 419,569,303,189,786,348,706,362,590,464,651,248,801, 369,597,406,570,219,680,311,897,409,611,190,708,421, 788,364,598,410,653,231,601,335,802,480,221,370,659, 451,543,315,792,127,688,422,572,372,613,425,833,235, 712,343,602,412,775,222,654,453,614,317,804,426,661, 237,617,675,376,834,433,559,347,604,243,779,454,618, 457,720,318,808,399,625,238,662,359,898,567, 428,665, 434,836,245,677,349,620,458,781,666,363,591,246,787, 465,736,407,626,350,816,707,436,571,249,840,460,678, 782,365,628,466,681,411,900,191,599,668,371,789,440, 709,803,481,573,366,682,250,848,632,423,689,468,790, 603,373,793,413,710,482,713,904,252,574,374,805,655, 427,794,472,615,684,377,864,690,223,835,414,605,714, 484,912,455,619,806,319,721,809,429, 663,435,606,796, 239,692,837,488,716,378,899,621,459,810,722,430,667, 817,380,627,437,838,696,247,841,737,461,928,622,496, 783,679,467,812,724,351,818,629,438,669,441,901,738, 251,842,630,462,849,683,791,367,728,960,469,633,820, 442,670,844,483,740,902,470,711,575,375,685,850,473, 691,795,744,253,824,634,415,905,715,444,865,686,807, 485,636,906,379,852,693,474, 797,717,913,486,752,866, 489,723,811,607,431,908,694,476,856,697,798,254,718, 914,868,381,623,839,725,490,929,698,497,813,739,819, 439,916,726,872,492,631,843,729,463,930,814,671,498, 920,700,821,382,845,741,961,443,635,880,730,903,500, 851,742,822,471,932,745,825,445,687,962,846,732,255, 907,637,853,504,826,746,936,867,475,753,964,854,695, 446,909,748,857,915, 487,719,799,944,477,754,828,869, 638,968,383,858,699,910,870,491,756,917,873,727,478, 931,815,701,860,874,493,976,760,881,918,731,499,823, 921,702,933,494,876,922,743,847,992,733,501,882,963, 827,639,934,502,884,937,747,855,924,734,505,965,829, 938,749,888,945,447,859,755,966,969,830,911,506,750, 871,940,946,757,861,970,508,875,758,977,919,862,948, 761,479,972, 877,978,923,703,883,952,993,495,878,762, 935,980,885,925,994,764,503,886,939,984,889,735,926, 996,967,831,941,507,947,751,1000,890,971,942,892, 949,759,973,1008,509,979,863,950,953, 763,974,879,981, 954,995,982,887,985,510,765,927,956,997,891,986,998, 1001,943,988,766,893, 1002,1009,951,1004,975,511,1010, 894,955,1012,983,957,767,1016,987,958,999,989,895, 1003,990,1005,1011,1006,1013,1014,1017,959,1018,1020, 991,1007,1015,1019,1021,1022,1023].

In some embodiments, the pre-defined sequence S4 includes: [0,1,2,4,8,16,32,3,5,6,64,9,10,128,17,12,18,512, 33,20,34,256,65,24,36,7,40,11,66,13,129,19,68, 130,48,14, 21,132,72,257,35,22,25,136,37,80,258,513,26,38,67,144, 41,96,260,514,28,69,42,160, 49,516,15,131,70,264,44,73, 50,192,23,520,74,52,133,81,272,76,27,528,134,288,39,82, 137,56,97,259,544,138,29,84,145,43,30,140,261,98,320, 265,71,576,146,45,88,51,161,100,515,262,148,46, 273,640, 75,266,53,162,104,152,517,384,77,135,164,193,768,54,83, 268,57,518,274,521,112,78,1 94,139,289,85,168,522,58, 290,276,86,196,141,31,60,529,99,89,524,147,176,321,280, 101,142,530 ,200,322,90,292,149,263,102,105,545,532,47, 163,92,150,296,208,385,267,546,153,106,324,536,165, 275,55,113,154,79,548,108,577,166,195,224,386,519,328, 269,169,277,59,304,578,114,552,156,270,197,87,170,61, 116,388,291,641,523,580,177,560,198,143,172,201,62,278, 336,281,91, 293,584,642,103,178,525,282,120,352,392, 202,531,93,526,769,644,592,294,151,180,209,107,32 3,297,325,284,204,94,533,210,770,648,608,400,155,184, 109,547,534,298,305,167,225,300,537, 772,115,387,212, 157,306,656,110,171,117,329,549,158,226,538,337,326, 416,271,672,776,63,550,389,199,118,579,173,540,216, 330,553,338,279,308,390,121,179,228,332,784,704,581, 554,448,312,174,393,122,181,232,283,527,561,582,353, 556,295,203,95,205,285,340,394,643,124,800,585,562, 182,354,211,401,299,185,206,586,240,564,535,344,645, 356,307,402,832,286,417,593,588,327,111,213,568,646, 301,418,186,360,594,396,159,539,227,309,771,896,649, 214,331,188,449,302,217,404,551,609,596,333,119,650, 541,218,310,339,773,368,229,408,233,420,230,657,610, 542,652,600,123,175,313,314,391,555,220,450,774,658, 334,612,395,341,777,424,355,125,234,183,583,207,557, 241,342,397,673,660,616,563,778,432,236,316,558,357, 287,187,674,345,398,40 3,664,785,587,624,452,780,361, 565,126,242,456,215,405,676,705,346,786,189,244,566, 409,589,647,358,303,362,569,464,706,680,595,419,406, 590,801,788,190,348,219,570,311,369,543,708, 421,802, 651,688,597,231,792,248,480,572,335,410,425,370,315, 611,598,804,833,712,221,422,6 53,364,601,235,317,775, 451,343,659,412,222,433,453,613,559,654,834,808,602, 720,372,127,23 7,614,426,243,604,897,661,836,816,454, 779,617,347,376,238,736,428,457,318,675,567,662,359, 465,840,245,618,898,349,434,665,781,399,591,625,436, 620,458,677,363,407,787,666,191,782, 571,900,848,246, 365,626,350,460,678,411,707,668,789,249,681,573,481, 628,599,371,423,904,8 64,466,803,574,468,790,413,440, 250,366,709,682,482,632,427,793,655,912,603,689,373, 710,68 4,223,414,472,805,252,794,374,615,713,690,429, 605,377,435,928,806,455,714,835,796,484,663,606,430, 692,809,619,319,721,378,459,716,239,437,696,960,837, 810,488,722,667,461,380,621, 247,783,467,817,838,627, 812,679,622,737,724,899,438,669,441,841,818,462,351, 469,575,367,7 38,629,670,442,728,842,683,791,820,251, 901,630,470,740,849,415,496,844,633,483,711,824,90 2,685,444,473,850,375,795,744,634,253,691,905,686,607, 254,807,865,852,636,715,485,906,431,797,752,693,474, 379,913,866,798,486,694,908,856,717,489,811,476,381, 697,623,723,914,868, 718,439,490,698,839,463,813,671, 929,916,382,725,872,819,497,700,814,443,631,492,739, 930,7 26,920,843,498,880,821,729,961,471,741,445,822, 730,845,825,851,846,745,742,932,635,255,96 2,826,903, 687,500,732,853,637,446,746,867,907,695,475,719,753, 936,854,487,909,944,748,828,504,869,799,699,477,857, 910,915,964,873,491,638,754,968,727,478,917,858,701, 756,383,921, 870,815,874,976,493,931,918,702,860,731, 499,823,881,933,743,494,847,501,922,827,760,447,7 33,876,934,963,882,937,924,992,855,747,502,829,734,965, 938,505,884,639,911,830,749,506,85 9,479,945,755,966, 871,940,750,969,888,508,861,946,919,757,703,970,875, 495,862,948,758,977,923,761,972,877,935,978,883,503, 952,762,925,735,878,993,980,939,885,926,831,764,507, 994, 967,886,941,751,984,889,509,947,996,942,971,890, 510,863,949,759,1000,973,892,950,979,953, 763,974,879, 1008,981,954,927,765,995,982,887,956,766,985,997,943, 986,891,511,998,1001,98 8,893,951,1002,975,894,1009, 955,1004,1010,983,957,767,1012,958,987,999,1016,989, 1003,990,895,1005,1011,1006,1013,959,1014,1017,1018, 991,1020,1007,1015,1019,1021,1022,1023].

In some embodiments, the pre-defined sequence S5 includes: [0,1,2,4,8,16,3,32,5,6,64,9,128,10,256,17,512,12, 18,33,20,34,65,7,24,36,11,66,129,40,13,19,14, 68,48,130, 72,21,257,35,132,22,80,258,136,25,513,260,96,37,26,38, 144,514,264,41,67,160,516,2 8,42,70,520,272,192,15,49, 69,288,73,131,44,50,528,82,133,23,320,52,74,544,27,81, 76,134,384, 137,39,56,576,97,259,29,43,84,138,640,261, 145,98,30,146,140,45,262,88,71,51,768,100,265,51 5,161, 148,46,517,53,104,266,77,273,162,268,75,152,54,193,112, 521,518,164,57,274,85,276,168,289,135,522,78,194,83,58, 139,196,529,290,280,90,176,99,524,147,31,321,60,200, 292,86,141,5 30,322,101,296,263,545,532,208,142,89,106, 149,385,92,324,546,304,536,47,224,267,163,102,3 86,55, 577,548,328,150,105,166,153,388,269,275,578,519,336, 552,79,59,87,113,108,165,270,15 4,641,580,392,560,352, 169,195,277,156,61,642,91,114,584,278,400,523,177,291, 197,170,62,11 6,201,769,644,281,592,120,143,198,172, 525,416,293,282,103,531,770,294,93,178,648,526,608, 284,151,323,180,107,202,448,209,297,772,656,533,298,94, 204,155,547,534,305,184,325,109,21 0,776,115,300,672, 537,326,167,225,110,271,212,387,549,538,117,329,157, 306,784,171,226,704,279,216,330,550,308,540,579,63,158, 389,553,800,118,337,173,312,199,332,390,179,554,581,2 28,121,283,832,338,393,556,561,182,203,232,122,582,340, 353,295,394,174,527,562,643,585,18 1,354,285,95,401, 124,205,344,299,396,240,896,586,564,286,211,356,645, 402,593,185,535,588, 213,568,186,307,646,594,111,404, 206,417,360,327,302,649,301,771,609,159,539,227,218, 188,4 18,408,650,596,368,309,331,119,610,600,551,449, 773,229,420,310,214,657,652,541,450,333,12 3,217,313, 612,542,774,424,658,555,175,230,391,339,334,220,341, 777,183,234,616,673,452,660,778,583,432,314,557,395, 355,125,563,233,674,664,287,316,624,207,456,342,190, 126,785,241, 780,558,357,705,345,397,676,565,587,786, 464,219,187,403,236,398,346,706,680,566,801,358,3 03,480,788,348,361,589,647,405,708,569,221,242,595,189, 215,244,688,406,802,590,792,570,41 9,311,362,712,833, 369,651,804,597,421,572,409,231,248,364,543,598,611, 335,653,410,720,834,315,422,370,808,601,235,425,412, 343,451,775,222,659,897,372,654,613,736,836,602,614, 317, 816,559,347,127,426,318,453,661,604,376,237,898, 617,840,433,675,779,243,662,428,454,359,3 99,567,618, 457,238,665,434,900,848,677,245,781,349,625,458,620, 591,787,904,666,363,782,19 1,407,465,436,864,350,626, 571,246,668,678,411,460,707,599,365,249,628,789,912, 681,466,440,573,790,682,423,632,250,371,574,803,709, 373,223,481,793,928,689,468,603,413,684,252,366, 427, 710,805,655,794,414,615,482,713,690,472,605,319,960, 374,692,806,835,796,714,435,429,8 09,484,721,606,377, 663,239,455,619,716,696,810,837,378,438,488,430,722, 459,812,817,667,83 8,627,621,351,247,380,724,679,737, 437,783,899,669,496,818,841,622,461,738,467,728,441, 629,820,842,251,670,683,901,575,469,740,849,844,791, 442,367,462,630,693,824,902,711,633,744, 415,483,850, 253,685,444,905,634,795,470,691,375,254,752,473,852, 715,865,686,906,807,636,6 07,485,856,866,797,379,476, 431,913,717,486,908,694,811,474,798,914,868,489,697, 723,381,62 3,439,718,819,872,916,813,929,698,839,490, 725,443,930,920,700,463,671,880,382,471,492,497,814, 739,726,843,631,821,961,932,729,822,741,962,936,445, 845,477,498,730,687,851,903,635, 825,732,742,846,446, 475,500,964,745,944,826,637,853,907,968,746,695,828, 799,638,867,255,4 87,753,504,909,748,854,857,915,719, 699,976,754,491,869,910,858,478,815,383,870,701,756,49 3,992,873,727,860,917,499,760,918,931,702,494,731,874, 881,921,823,501,743,933,876,847,447,922,827,733,882, 937,502,747,934,734,924,855,963,505,639,884,829,749, 506,965,938,888,859, 830,755,479,945,508,940,871,969, 966,911,750,757,861,946,977,877,703,919,970,948,758, 862,4 95,761,883,972,875,923,952,978,762,935,993,878, 980,735,925,503,764,885,939,994,926,984,83 1,889,507, 886,967,996,941,751,947,1000,942, 890,509,949,971,510, 863,759,892,954,1008,973,9 50,979,763,953,981,879,974, 986,765,995,927,956,887,766,997,982,891,985,943,998, 1001,988,9 51,893,511,1002,975,958,894,983,955,1009, 1004,987,1010,957,1012,989,767,999,1016,1003,99 0,895, 1005,1011,1006,1013,959,1014,1017,1018,991,1020,1007, 1015,1019,1021,1022,1023].

In an example, when $n_1=0$ and $n_2=31$, the $0^{th}$ to the $30^{th}$ construction sequence indexes of the disclosed construction sequence indexes are [0,1,2,4,8,16,3,5,9,6,17,10,18,12,20, 24,7,11,19,13,14,21,26,25,22,28,15,23,27,29,30,31], which are each identical to the $0^{th}$ to the $30^{th}$ sequence indexes of the pre-defined sequence S1, for example.

In another example, when $n_1=65$ and $n_2=127$, the $65^{th}$ to the $127^{th}$ construction sequence indexes of the disclosed construction sequence indexes are [64,65,66,68,72,80,96, 67,69,70,73,74,81,76,82,97,84,98,88,71,100,75,104,77,83, 112,78,85,99,8 6,89,101,90,105,102,92,106,113,79,108, 114,116,87,91,120,103,93,107,94,109,115,110,117,118, 121,122,124,95,111,119,123,125,126,127], which are each identical to the $65^{th}$ to the $127^{th}$ sequence indexes of the pre-defined sequence S2, for example.

In yet another example, when $n_1=0$ and $n_2=127$, and n=128, the $0^{th}$ to the $127^{th}$ construction sequence indexes of the disclosed construction sequence indexes are each identical to the $0^{th}$ to the $127^{th}$ sequence indexes of the pre-defined sequence S1 (i.e., the common pre-defined sequence), and the $128^{th}$ to the $255^{th}$ construction sequence indexes of the disclosed construction sequence indexes are also each identical to the $0^{th}$ to the $127^{th}$ sequence indexes of the pre-defined sequence S1 (128 minus 0 is the given offset n, 128) sequence indexes of the common pre-defined sequence S1.

Still in yet another example, when $n_1=0$ and $n_2=127$, n=128, and N=1024 (a total number of sequence indexes that can be selected from the pre-defined sequences S1 to S5, as will be discussed below), the $0^{th}$ to the $127^{th}$ construction sequence indexes of the disclosed construction sequence indexes are each identical to a common sequence formed of the $0^{th}$ to the $127^{th}$ sequence indexes of the pre-defined sequence S1, and the $128^{th}$ to the $255^{th}$ construction sequence indexes of the disclosed construction sequence indexes are still each identical to the common sequence, and other construction sequence indexes (e.g., the $256^{th}$ to $1023^{th}$) of the disclosed construction sequence indexes are each identical to the $256^{th}$ to the $1023^{th}$ sequence indexes of the pre-defined sequence S3, for example.

Embodiment 2

As mentioned above, a method to determine respective indexes to place information bits based on a transmission requirement is disclosed. In general, when information bits with K bits are provided, such information bits may be processed by the Polar encoder to generate the Polar code output. In some cases, due to some transmission requirement, a subset of the Polar code output may not be transmitted, and such a subset of the Polar code output may be each associated with a sequence index. The disclosed method is directed to determining respective indexes in the construction sequence where the K information bits can be placed using a virtual code rate, which is 1, in order to meet the above-mentioned transmission requirement. After the K information bits are placed in respective indexes, those K information bits can be processed by the Polar encoder to generate a corresponding Polar code output.

Figure 3:
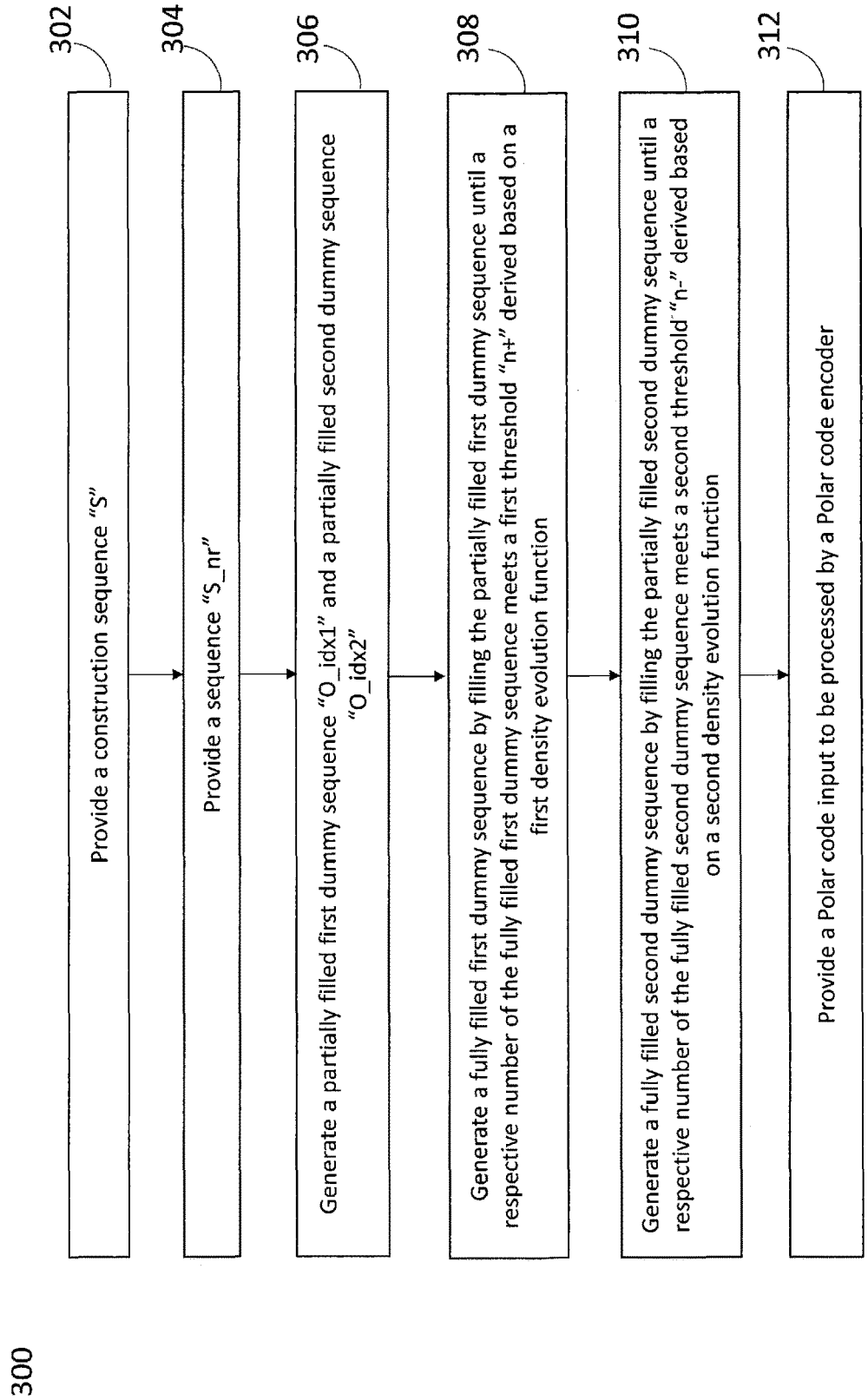
FIG. 3 illustrates a flow chart of an exemplary method to determine respective indexes to place information bits based on a transmission requirement, in accordance with some embodiments of the present disclosure.

In some embodiments, the disclosed method may be implemented by performing the operations as illustrated in a flow chart of an exemplary method 300 of FIG. 3. The method 300 stars with operation 302 in which a construction sequence "S" is provided. In some embodiments, the construction sequence S includes a plurality of construction sequence indexes with a number of N that is a power of 2. The method 300 continues to operation 304 in which a sequence "S_nr" is provided. In some embodiments, the second sequence S_nr includes a plurality of sequence indexes, wherein the plurality of sequence indexes correspond to a subset of the Polar code output that is not to be transmitted.

Next, the method 300 continues to operation 306 in which a partially filled first dummy sequence "O_idx1" and a partially filled second dummy sequence "O_idx2" are respectively generated. In some embodiments, the partially filled first dummy sequence is generated by selecting a first subset of the plurality of sequence indexes of S_nr that are each within a first index range "0 to N/2−1," and the partially filled second dummy sequence is generated by selecting a second subset of the plurality of sequence indexes of S_nr that are each within a second index range "N/2 to N−1." Further, in operation 306, the construction sequence S may be divided into first and second candidate sequences S1 and S2 based on the first and second index ranges, respectively, according to some embodiments. In particular, an order of the first candidate sequence S1 may follow an order of the construction sequence S, and an order of the second candidate sequence S2 may also follow the order of the construction sequence S.

The method 300 continues to operation 308 in which a fully filled first dummy sequence is generated by filling the partially filled first dummy sequence with other construction sequence indexes, different from the first subset of the plurality of sequence indexes of S_nr, in the first candidate sequence until a respective number of the fully filled first dummy sequence meets a first threshold "n+" derived based on a first density evolution function. In some embodiments, an order of using the indexes in the first candidate sequence S1 to fill the partially filled first dummy sequence may follow the order of the construction sequence S, i.e., starting with the use of a less reliable construction sequence index at each operation of filling. The method 300 continues to operation 310 in which a fully filled second dummy sequence is generated by filling the partially filled second dummy sequence with other construction sequence indexes, different from the second subset of the plurality of construction sequence indexes of S_nr, in the second candidate sequence until a respective number of the fully filled second dummy sequence meets a second threshold "n−" derived based on a second density evolution function. Similarly, in some embodiments, an order of using the indexes in the second candidate sequence S2 to fill the partially filled second dummy sequence may follow the order of the construction sequence S, i.e., starting with the use of a less reliable construction sequence index at each operation of filling. In some embodiments, the first and second density evolution functions to derive n+ and n− are respectively expressed as:

$$n-=\alpha R^2+\Delta_1$$

$$n+=\beta(2R-R^2)+\Delta_2$$

wherein R is K/M; $\Delta_1$ and $\Delta_2$ are related to K and M; $\alpha$ and $\beta$ are each a pre-defined constant; and M represents a number of bits to be transmitted.

Next, the method 300 continues to operation 312 in which the Polar code input to be processed by the Polar code encoder is provided. In some embodiments, the Polar code input includes a plurality of information bits that are placed on respective indexes based on a difference between the construction sequence S and a combination "O_idx" of the fully filled first and second dummy sequences. In some embodiments, a number of the sequence indexes contained in the combination O_inx may be N−K, wherein K is the bit number of information bits prior to being processed by the Polar encoder. As the index number of O_idx may be N−K, the virtual code rate is K/(N−(N−K))=1.

In an example where N=16 and K=5, corresponding to operations 302 and 304, respectively, the construction sequence S may be provided as {0, 1, 2, 4, 8, 3, 5, 6, 9, 10, 12, 7, 11, 13, 14, 15} and the sequence S_nr may be provided as {3, 7, 12, 14}, wherein the construction sequence S and the sequence S_nr are constituted by respective construction sequence indexes and sequence indexes, as shown above. Corresponding to operation 306, the first index range 0 to 7 and the second index range 8 to 15 are provided, respectively, which causes the construction sequence S to be divided into two candidate sequences S1, {0, 1, 2, 3, 4, 5, 6, 7}, and S2, {8, 9, 10, 11, 12, 13, 14, 15}. The partially filled first dummy sequence is generated by selecting {3, 7} from the second construction sequence S_nr since {3, 7} are each within the first index range 0 to 7. And the partially filled second dummy sequence is generated by selecting {12, 14} from the sequence S_nr since {12, 14} are each within the second index range 8 to 15. Corresponding to operation 308, the fully filled first dummy sequence is generated by filling the partially filled first dummy sequence {3,7} with other construction sequence indexes of the candidate sequence S1 until the number of construction sequence indexes contained in the first dummy sequence O_idx1 reaches n+, which is 5 based on the above density evolution function. As such, O_idx1={3, 7, 0, 1, 2}. Corresponding to operation 310, the fully filled second dummy sequence is generated by filling the partially filled second dummy sequence {12, 14} with other construction sequence indexes of the candidate sequence S2 until the number of construction sequence indexes contained in the second dummy sequence O_idx2 reaches n−, which is 6 based on the above density evolution function. As such, O_idx2={12, 14, 8, 9, 10, 11}. Corresponding to operation 312, O_idx is the combination of O_idx1 and O_idx2 so O_idx={3, 7, 0, 1, 2, 12, 14, 8, 9, 10, 11}. And the difference between the construction sequence S and the combination O_idx is {4, 5, 6, 13, 15}, which corresponds to indexes to place the information bits. Thus, the Polar code input to be processed by the Polar encoder is provided.

Embodiment 3

Figure 4:
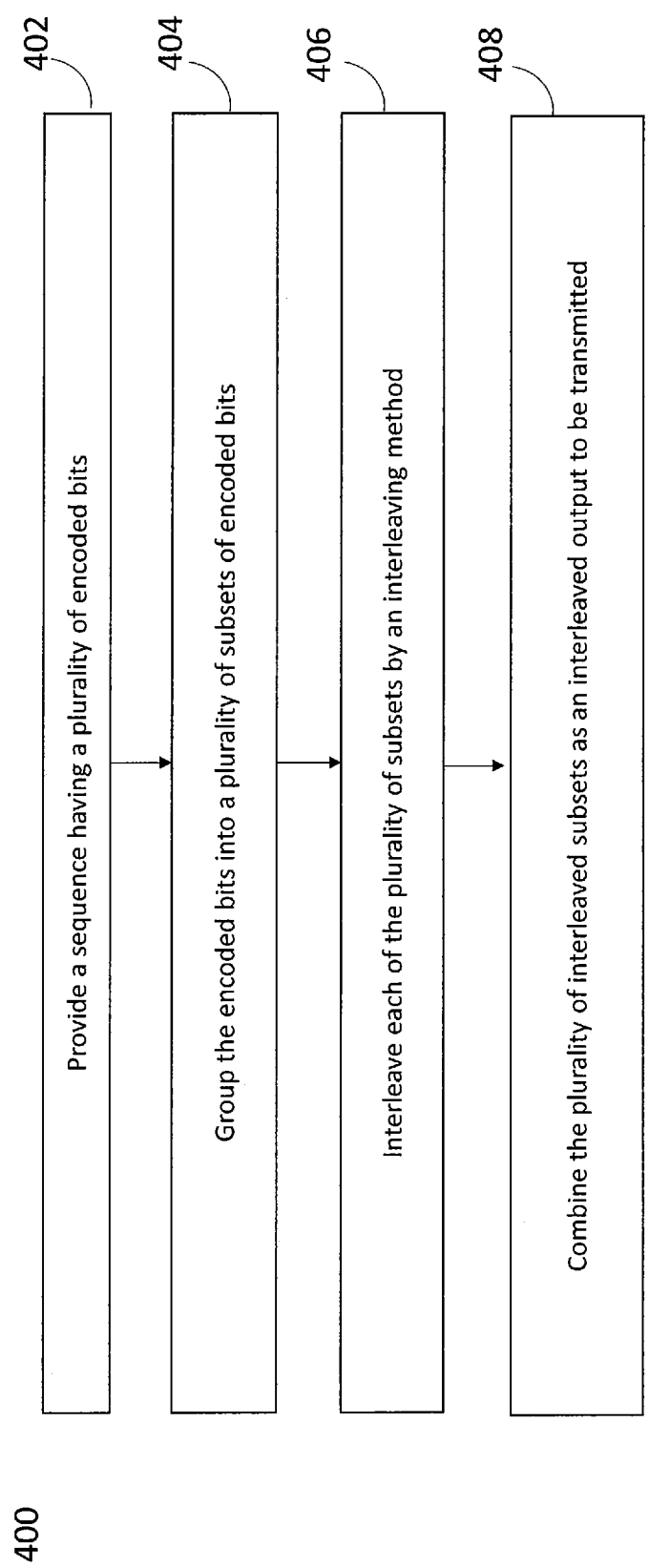
FIG. 4 illustrates a flow chart of an exemplary method to perform an interleaving technique on a Polar code output, in accordance with some embodiments of the present disclosure.

As mentioned above, a novel interleaving technique to process the Polar code output is disclosed. In some embodiments, the disclosed interleaving technique may be implemented by performing the operations as illustrated in a flow chart of an exemplary method 400 of FIG. 4. The method 400 starts with operation 402 in which a sequence, having a plurality of encoded bits, is provided. The method 400 continues to operation 404 in which the plurality of encoded bits are grouped into a plurality of subsets of encoded bits. In some embodiments, a number of the subsets, "m," is determined by the M divided by a respective modulation order or determined by M divided by the least common multiple of all modulation orders supported by the communication system, wherein the M represents the number of bits to be transmitted, as used above. More specifically, each subset has a respective number of encoded bits, represented by "$m_i$," wherein "i" represents the group index. The method 400 continues to operation 406 in which the plurality of subsets are each interleaved by an interleaving method. In some embodiments, the interleaving method may be performed using a random number generator, a bit reversal order (BRO) function, a stagger and combination method, a ranking method, and/or a column-row interleaving method, which will be each discussed in further detail below using a respective example. In some alternative embodiments, the operation 406 may include interleaving an initial one of the plurality of subsets of encoded bits by an initial interleaving pattern (which is used to refer the relationship before or after being interleaved, e.g., if the interleaving pattern is {4,2,3,1,0} and the encoded bits before interleaver is {$x_0, x_1, x_2, x_3, x_4$} ($x^N$ are defined as encoded bits in the background), then after being interleaved, the bits are {$x_4, x_2, x_3, x_1, x_0$}); and interleaving remaining ones of the plurality of subsets of encoded bits by respectively adding an offset present between each of the remaining ones and the interleaving pattern of initial the plurality of subsets of encoded bits or circularly shifting the interleaving pattern of the initial plurality of subsets of encoded bits The method 400 continues to operation 408 in which the plurality of interleaved subsets are combined to provide an interleaved sequence for updating the indexes of the Polar code output.

Regarding the random number generator, in an example where 8 (M=8) encoded bits, {x0, x1, x2, x3, x4, x5, x6, x7}, are divided into 2 (m=2) subsets, through the random number generator, the indexes of a first subset {0, 1, 2, 3} are randomized to generate a first interleaved pattern, {0, 2, 1, 3}, for example, and the interleaved first subset is {x0, x2, x1, x3}. In some embodiments, a second subset (i.e., the remaining one) {x4, x5, x6, x7} may be interleaved by the same random number generator to generate an interleaved second subset. In some other embodiments, the second interleaving pattern may be generated by adding an offset between the first and second interleaving patterns, which is 4 in the current example. As such, the interleaved second subset is {x4, x6, x5, x7}. Based on the above discussion, when the interleaved second subset is derived by adding the offset, the interleaved encode bits may become {x0, x2, x1, x3, x4, x6, x5, x7}.

Regarding the BRO method, in an example where 8 (M=8) encoded bits, {x0, x1, x2, x3, x4, x5, x6, x7}, are divided into 2 (m=2) subsets, through the BRO method, the indexes of a first subset {0, 1, 2, 3} are each transformed into an equivalent binary number, {00, 01, 10, 11}, reversed to become {00, 10, 01, 11}, and then transformed back to an equivalent decimal number, {0, 2, 1, 3}, which is a first interleaved pattern and the interleaved first subset is {x0, x2, x1, x3}. In some embodiments, a second subset (i.e., the remaining one) {x4, x5, x6, x7} may be interleaved by the same BRO method to generate an interleaved second subset. In some other embodiments, the second interleaving pattern may be generated by adding an offset between the first and second interleaving patterns, which is 4 in the current example. As such, the interleaved second subset is {x4, x6, x5, x7}. Based on the above discussion, when the interleaved second subset is derived by adding the offset, the interleaved encode bits may become {x0, x2, x1, x3, x4, x6, x5, x7}.

Regarding the stagger and combination method, using the same pre-interleaved encoded bits as an example, the encoded bits are divided into four subsets: Q1={x0, x1}, Q2={x2, x3}, Q3={x4, x5}, Q4={x6, x7}, wherein Q2 and Q3 that are to be staggered and combined are required to have a same number of encoded bits. Further, through the stagger and combination method, an interleaved subset is generated as {x2, x4, x3, x5} by placing the first encoded bit of Q2 as a first encoded bit of the interleaved subset, placing the first encoded bit of Q3 as a second encoded bit of the interleaved subset, placing the second encoded bit of Q2 as a third encoded bit of the interleaved subset, placing the second encoded bit of Q3 as a fourth encoded bit of the interleaved subset, and so on. Similarly, Q1, the staggered and combined Q2 and Q3, and Q4 are combined to generate the interleaved encoded bits {x0, x1, x2, x4, x3, x5, x6, x7}.

Regarding the ranking method, in an example where 32 (M=32) encoded bit, {x0, x1, x2, x3, x4, x5, x6, x7, x8, x9, x10, x11, x12, x13, x14, x15, x16, x17, x18, x19, x20, x21, x22, x23, x24, x25, x26, x27, x28, x29, x30, x31}, are divided into 2 (m=2) subsets, through the ranking method, a monotonic function is used to generate 16 reliability values {0, 1, 1.18, 2.18, 1.41, 2.41, 2.60, 3.60, 1.68, 2.68, 2.87, 3.87, 3.09, 4.09, 4.28, 5.28} for encoded bit indexes {0, 1, 2, 3, 4, 5, 6, 7, 8, 9, 10, 11, 12, 13, 14, 15}, respectively. Based on the reliability values, in some embodiments, the first interleaved pattern is generated by ranking the metric values of the first encoded bit subset indexes from the smallest to the largest, which is shown as {0, 1, 2, 4, 8, 3, 5, 6, 9, 10, 12, 7, 11, 13, 14, 15}. In some other embodiments, the interleaved first subset may be generated by ranking the metric values of the encoded bit subset indexes from the largest to the smallest while remaining within the scope of the present disclosure. Similarly, an interleaved second pattern may be generated by either adding an offset (e.g., 16) between the first and second subsets, or applying the same ranking method.

Regarding the column-row interleaving method, in an example where 16 (M=16) encoded bits, {x0, x1, x2, x3, x4, x5, x6, x7, x8, x9, x10, x11, x12, x13, x14, x15, x16}, are divided into 2 (m=2) subsets, through the column-row interleaving method, the encoded bits of a first subset {x0, x1, x2, x3, x4, x5, x6, x7} are placed in a column-row interleaver, as shown below.

| 0  | 1  | 2  | 3  |
|----|----|----|----|
| x0 | x1 | x2 | x3 |
| x4 | x5 | x6 | x7 | wherein values along the first row of the column-row interleaver each represents a column index of the column-row interleaver. In some embodiments, the sequence indexes are written into the column-row interleaver either by row or column of the column-row interleaver. In the above example, the sequence indexes of the first subset are written into the column-row interleaver by rows. Next, in some embodiments, the column indexes of the column-row interleaver are interleaved using the above-described BRO method. As such, the column-row interleaver may become:

| 0  | 2  | 1  | 3  |
|----|----|----|----|
| x0 | x2 | x1 | x3 |
| x4 | x6 | x5 | x7 |

Next, in some embodiments, the written sequence indexes of the first subset are read from the column-row interleaver either by row or column of the column-row interleaver. For example, when the written sequence indexes are read by column, the read-out encoded bits of the first subset are {x0, x4, x2, x6, x1, x5, x3, x7}. Such read-out sequence indexes may constitute an interleaved first subset. Similarly, an interleaved second subset may be generated by either adding an offset (e.g., 8) between the first and second subsets, or applying the same column-row interleaving method. In some embodiments, the column indexes of the column-row interleaver are interleaved using the above-described a stagger and combination method or a ranking method.

While various embodiments of the invention have been described above, it should be understood that they have been presented by way of example only, and not by way of limitation. Likewise, the various diagrams may depict an example architectural or configuration, which are provided to enable persons of ordinary skill in the art to understand exemplary features and functions of the invention. Such persons would understand, however, that the invention is not restricted to the illustrated example architectures or configurations, but can be implemented using a variety of alternative architectures and configurations. Additionally, as would be understood by persons of ordinary skill in the art, one or more features of one embodiment can be combined with one or more features of another embodiment described herein. Thus, the breadth and scope of the present disclosure should not be limited by any of the above-described exemplary embodiments.

It is also understood that any reference to an element herein using a designation such as "first," "second," and so forth does not generally limit the quantity or order of those elements. Rather, these designations can be used herein as a convenient means of distinguishing between two or more elements or instances of an element. Thus, a reference to first and second elements does not mean that only two elements can be employed, or that the first element must precede the second element in some manner.

Additionally, a person having ordinary skill in the art would understand that information and signals can be represented using any of a variety of different technologies and techniques. For example, data, instructions, commands, information, signals, bits and symbols, for example, which may be referenced in the above description can be represented by voltages, currents, electromagnetic waves, magnetic fields or particles, optical fields or particles, or any combination thereof.

A person of ordinary skill in the art would further appreciate that any of the various illustrative logical blocks, modules, processors, means, circuits, methods and functions described in connection with the aspects disclosed herein can be implemented by electronic hardware (e.g., a digital implementation, an analog implementation, or a combination of the two), firmware, various forms of program or design code incorporating instructions (which can be referred to herein, for convenience, as "software" or a "software module"), or any combination of these techniques. To clearly illustrate this interchangeability of hardware, firmware and software, various illustrative components, blocks, modules, circuits, and steps have been described above generally in terms of their functionality. Whether such functionality is implemented as hardware, firmware or software, or a combination of these techniques, depends upon the particular application and design constraints imposed on the overall system. Skilled artisans can implement the described functionality in various ways for each particular application, but such implementation decisions do not cause a departure from the scope of the present disclosure.

Furthermore, a person of ordinary skill in the art would understand that various illustrative logical blocks, modules, devices, components and circuits described herein can be implemented within or performed by an integrated circuit (IC) that can include a general purpose processor, a digital signal processor (DSP), an application specific integrated circuit (ASIC), a field programmable gate array (FPGA) or other programmable logic device, or any combination thereof. The logical blocks, modules, and circuits can further include antennas and/or transceivers to communicate with various components within the network or within the device. A general purpose processor can be a microprocessor, but in the alternative, the processor can be any conventional processor, controller, or state machine. A processor can also be implemented as a combination of computing devices, e.g., a combination of a DSP and a microprocessor, a plurality of microprocessors, one or more microprocessors in conjunction with a DSP core, or any other suitable configuration to perform the functions described herein.

If implemented in software, the functions can be stored as one or more instructions or code on a computer-readable medium. Thus, the steps of a method or algorithm disclosed herein can be implemented as software stored on a computer-readable medium. Computer-readable media includes both computer storage media and communication media including any medium that can be enabled to transfer a computer program or code from one place to another. A storage media can be any available media that can be accessed by a computer. By way of example, and not limitation, such computer-readable media can include RAM, ROM, EEPROM, CD-ROM or other optical disk storage, magnetic disk storage or other magnetic storage devices, or any other medium that can be used to store desired program code in the form of instructions or data structures and that can be accessed by a computer.

In this document, the term "module" as used herein, refers to software, firmware, hardware, and any combination of these elements for performing the associated functions described herein. Additionally, for purpose of discussion, the various modules are described as discrete modules; however, as would be apparent to one of ordinary skill in the art, two or more modules may be combined to form a single module that performs the associated functions according embodiments of the invention.

Additionally, memory or other storage, as well as communication components, may be employed in embodiments of the invention. It will be appreciated that, for clarity purposes, the above description has described embodiments of the invention with reference to different functional units and processors. However, it will be apparent that any suitable distribution of functionality between different functional units, processing logic elements or domains may be used without detracting from the invention. For example, functionality illustrated to be performed by separate processing logic elements, or controllers, may be performed by the same processing logic element, or controller. Hence, references to specific functional units are only references to a suitable means for providing the described functionality, rather than indicative of a strict logical or physical structure or organization.

Various modifications to the implementations described in this disclosure will be readily apparent to those skilled in the art, and the general principles defined herein can be applied to other implementations without departing from the scope of this disclosure. Thus, the disclosure is not intended to be limited to the implementations shown herein, but is to be accorded the widest scope consistent with the novel features and principles disclosed herein, as recited in the claims below.

What is claimed is:

1. A method for channel coding, comprising:
receiving, by a Polar code encoder, a plurality of information bits;
encoding, by the Polar code encoder, the plurality of information bits using a construction sequence to generate a plurality of encoded information bits, wherein the construction sequence comprises a plurality of construction sequence indexes, wherein the encoding comprises placing the plurality of information bits on respective indexes according to at least one of a plurality of subsets of the construction sequence indexes, wherein a first one of the plurality of subsets of the construction sequence indexes comprises at least a first group of construction sequence indexes and a second group of construction sequence indexes that meet a first criterion, and wherein each of the first group of construction sequence indexes is offset from a respective one of the second group of construction sequence indexes by a constant value; and
transmitting the plurality of encoded information bits over a wireless communication channel.

2. The method of claim 1, wherein a second one of the plurality of subsets of the construction sequence indexes is generated by ranking a first plurality of construction sequence indexes based on respective associated reliability values.

3. The method of claim 2, wherein the respective associated reliability values are generated based on a monotonic function.

4. The method of claim 1, wherein a second one of the plurality of subsets of the construction sequence indexes comprises at least a first construction sequence index and a second construction sequence index that meet a second criterion: the first construction sequence index is arranged either before or after the second first construction sequence index, and an equivalent binary number of the first construction sequence index comprises a first bit and an equivalent binary number of the second construction sequence indexes comprises a second bit, wherein the first and second bits are logically inverted to each other, and remaining bits of the equivalent binary number of the first construction sequence index are each identical to a corresponding one of remaining bits of the equivalent binary number of the second construction sequence index.

5. The method of claim 4, wherein all remaining construction sequence indexes in the second one of the plurality of subsets of the construction sequence indexes are formed as one or more pairs that each follows a same order of the first and second construction indexes.

6. The method of claim 4, wherein a third one of the plurality of subsets of the construction sequence indexes comprises at least a third construction sequence index and a fourth construction sequence index that meet a third criterion: the third construction sequence index is arranged either before or after the fourth first construction sequence index, and an equivalent binary number of the third construction sequence index comprises third and fourth bits and an equivalent binary number of the fourth construction sequence indexes comprises fifth and sixth bits, wherein the third and fifth bits, and the fourth and sixth bits are respectively logically inverted to each other, and remaining bits of the equivalent binary number of the third construction sequence index are each identical to a corresponding one of remaining bits of the equivalent binary number of the fourth construction sequence index.

7. The method of claim 6, wherein all remaining construction sequence indexes in the third one of the plurality of subsets of the construction sequence indexes are formed as one or more pairs that each follows a same order of the third and fourth construction indexes.

8. The method of claim 1, wherein a second one of the plurality of subsets of the construction sequence indexes is generated based on a plurality of sub-sequences, and wherein each construction sequence index of the second one of the plurality of subsets of the construction sequence indexes are each selected from a sub-construction sequence index of one of the plurality of sub-sequences.

9. A wireless communication node configured for channel coding, comprising:
at least one processor configured to:
receive a plurality of information bits;

encode the plurality of information bits using a construction sequence to generate a plurality of encoded information bits, wherein the construction sequence comprising a plurality of construction sequence indexes, wherein the encoding comprises placing the plurality of information bits on respective indexes according to at least one of a plurality of subsets of the construction sequence indexes, wherein a first one of the plurality of subsets of the construction sequence indexes comprises at least a first group of construction sequence indexes and a second group of construction sequence indexes that meet a first criterion, and wherein each of the first group of construction sequence indexes is offset from a respective one of the second group of construction sequence indexes by a constant value; and transmit the plurality of encoded information bits over a wireless communication channel.

10. The wireless communication node of claim 9, wherein a second one of the plurality of subsets of the construction sequence indexes is generated by ranking a first plurality of construction sequence indexes based on respective associated reliability values.

11. The wireless communication node of claim 10, wherein the respective associated reliability values are generated based on a monotonic function.

12. The wireless communication node of claim 9, wherein:

a second one of the plurality of subsets of the construction sequence indexes comprises at least a first construction sequence index and a second construction sequence index that meet a first criterion;

the first construction sequence index is arranged either before or after the second first construction sequence index;

an equivalent binary number of the first construction sequence index comprises a first bit and an equivalent binary number of the second construction sequence indexes comprises a second bit, wherein the first and second bits are logically inverted to each other; and remaining bits of the equivalent binary number of the first construction sequence index are each identical to a corresponding one of remaining bits of the equivalent binary number of the second construction sequence index.

13. The wireless communication node of claim 12, wherein all remaining construction sequence indexes in the second one of the plurality of subsets of the construction sequence indexes are formed as one or more pairs that each follows a same order of the first and second construction indexes.

14. The wireless communication node of claim 12, wherein:

a third one of the plurality of subsets of the construction sequence indexes comprises at least a third construction sequence index and a fourth construction sequence index that meet a second criterion;

the third construction sequence index is arranged either before or after the fourth first construction sequence index;

an equivalent binary number of the third construction sequence index comprises third and fourth bits and an equivalent binary number of the fourth construction sequence indexes comprises fifth and sixth bits, wherein the third and fifth bits, and the fourth and sixth bits are respectively logically inverted to each other; and remaining bits of the equivalent binary number of the third construction sequence index are each identical to a corresponding one of remaining bits of the equivalent binary number of the fourth construction sequence index.

15. The wireless communication node of claim 14, wherein all remaining construction sequence indexes in the third one of the plurality of subsets of the construction sequence indexes are formed as one or more pairs that each follows a same order of the third and fourth construction indexes.

16. The wireless communication node of claim 9, wherein a second one of the plurality of subsets of the construction sequence indexes is generated based on a plurality of sub-sequences, and wherein each construction sequence index of the fifth one of the plurality of subsets of the construction sequence indexes are each selected from a sub-construction sequence index of one of the plurality of sub-sequences.

* * * * *